(12) United States Patent
Castro

(10) Patent No.: US 10,653,030 B1
(45) Date of Patent: May 12, 2020

(54) WATER INGRESS PREVENTION IN ELECTRONIC COMPONENTS

(71) Applicant: ILLINOIS TOOL WORKS INC., Glenview, IL (US)

(72) Inventor: Fernando L. Castro, Westwood, MA (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 0 days.

(21) Appl. No.: 16/205,477

(22) Filed: Nov. 30, 2018

(51) Int. Cl.
  *H05K 7/14* (2006.01)
  *H05K 5/02* (2006.01)
  *H05K 5/03* (2006.01)

(52) U.S. Cl.
  CPC ......... *H05K 7/1424* (2013.01); *H05K 5/0217* (2013.01); *H05K 5/03* (2013.01)

(58) Field of Classification Search
  None
  See application file for complete search history.

(56) References Cited

U.S. PATENT DOCUMENTS

| | | | | |
|---|---|---|---|---|
| 6,462,270 B1* | 10/2002 | Depp | ...................... | H02G 3/081 174/50 |
| 6,635,823 B2* | 10/2003 | Kasai | ...................... | H02G 3/088 174/50 |
| 6,774,309 B2* | 8/2004 | Kasai | ...................... | H02G 3/14 174/17 R |
| 7,671,275 B2* | 3/2010 | Kubota | .............. | H01R 13/5227 174/17 R |
| 7,786,391 B1* | 8/2010 | Van Pelt | .................. | H02G 3/18 16/2.1 |
| 8,134,840 B2* | 3/2012 | Yoshida | ................ | G06F 1/1616 361/752 |
| 8,619,417 B1* | 12/2013 | Helton | .................. | G06F 1/1632 361/679.41 |
| 8,982,541 B1* | 3/2015 | Roberts | ................ | A63H 17/262 361/679.01 |
| 9,000,297 B2* | 4/2015 | Makino | ................ | H05K 5/0208 174/50 |
| 9,832,893 B2* | 11/2017 | Yamada | ............... | H05K 5/0047 |

(Continued)

FOREIGN PATENT DOCUMENTS

| GB | 2462842 | 2/2010 |
|---|---|---|
| JP | 2002325212 | 11/2002 |

(Continued)

OTHER PUBLICATIONS

International Search report issued in PCT/US2019/053058 dated Jan. 2, 2020.

*Primary Examiner* — Xanthia C Cunningham
(74) *Attorney, Agent, or Firm* — McCarter & English, LLP

(57) ABSTRACT

The present disclosure relates to methods and devices for preventing or minimizing water ingress in electronic components, particularly card cages or similarly sized and configured components, which may be used in many applications including, but not limited to, materials testing. A gutter is formed around a first portion of the perimeter of a chassis cover and a second channel is formed around a second portion of the perimeter of the chassis cover. This configuration is arranged and constructed to direct the impinging water or liquid away from such components as the air intake, the backplane, openings and exposed electronic terminals.

20 Claims, 4 Drawing Sheets

(56) References Cited

U.S. PATENT DOCUMENTS

| | | | | |
|---|---|---|---|---|
| 10,070,540 | B2 * | 9/2018 | Campagna | H05K 5/06 |
| 10,184,643 | B2 * | 1/2019 | Oksengendler | F21V 15/012 |
| 2008/0149385 | A1 * | 6/2008 | Kanamaru | H02G 3/083 |
| | | | | 174/520 |
| 2010/0309639 | A1 * | 12/2010 | Nagaike | H04M 1/0266 |
| | | | | 361/760 |
| 2015/0077956 | A1 * | 3/2015 | Sano | H01R 13/6658 |
| | | | | 361/752 |
| 2017/0217388 | A1 * | 8/2017 | Ghannam | B60R 16/0239 |

FOREIGN PATENT DOCUMENTS

| | | |
|---|---|---|
| JP | 2011063124 | 3/2011 |
| WO | 2013/046261 | 4/2013 |

* cited by examiner

WATER INGRESS PREVENTION IN ELECTRONIC COMPONENTS

BACKGROUND OF THE DISCLOSURE

Field of the Disclosure

The present disclosure relates to methods and devices for preventing or minimizing water ingress in electronic components, particularly card cages or similarly sized and configured components.

Description of the Prior Art

The concept of protecting electronics against water or debris ingress is well understood and applied. Many products, notably smart phone manufacturers recently, readily advertise the Ingress Protection (IP) rating of their devices to market the robustness of their products against contact with, or in some cases submersion in, water.

Moreover, dripping within the context of electronic apparatus may be caused by condensation or melting from a temperature chamber or the dripping of saline or other solution from a materials, biomedical or similar testing device.

When applied to larger electronics in commercial applications, the problem is typically addressed by housing the components in a weather-tight box. Whether customized for a given application or using one of many available products in the marketplace, the solution typically includes a plastic or metal box where the cover may or may not have a gasket and locations along the box where holes may be cut or punched out to allow for connections to the outside. These solutions work quite well for placing a series of related electric or electronic components, including individually-mounted printed circuit boards.

No solution was found that offers water ingress mitigation for a card cage that houses multiple boards that blind-mate to a midplane or backplane board. Typically, such card cages are inside another structure that guarantees protection from water ingress at the higher level (parent) structure.

OBJECTS AND SUMMARY OF THE DISCLOSURE

It is therefore an object of the present disclosure to provide improvements to minimize or eliminate water leakage into electronic components, particularly a card cage, or electronic components that are similarly sized and configured.

The disclosed embodiment works around the need for an expensive and large solution or requiring the machine to provide water ingress protection through sealing embodiments. It has been found that attempting to seal against water ingress at the machine level results in considerable complexity and cost increases.

The disclosed embodiment of the method and apparatus includes providing formed features built into the electronics enclosure's sheet metal chassis such that it redirects water away from the sensitive electronics. In effect, the chassis cover has, along its perimeter, gutters, raised lips and designated openings to control where water may run off so as to avoid various elements of electronic enclosure which may be susceptible to water.

BRIEF DESCRIPTION OF THE DRAWINGS

Further objects and advantages of the disclosure will become apparent from the following description and from the accompanying drawings, wherein:

FIG. 7 is a third edge view of an embodiment of the chassis cover of the present disclosure.

DETAILED DESCRIPTION OF THE PREFERRED EMBODIMENTS

Figure 1:
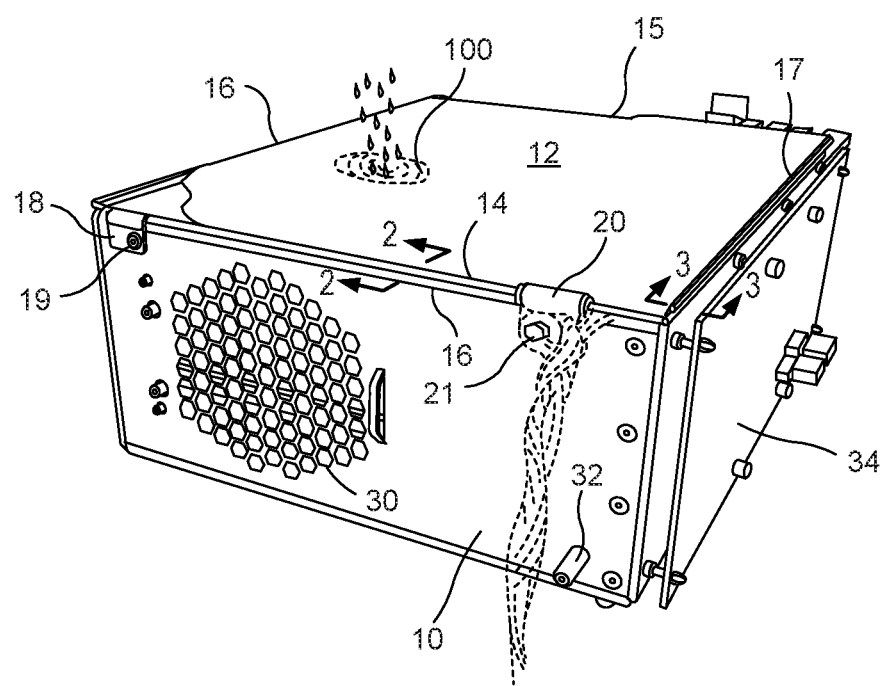
FIG. 1 is a perspective view of an embodiment of the present disclosure, such as may be used in a materials testing application, but is not limited thereto.

Referring now to the drawings in detail, one sees that FIG. 1 is an embodiment of the electronics enclosure 10 (such as, but not limited to, a card cage, and farther particularly adaptable to a materials testing device) of the present disclosure, illustrating how water or other liquid dripping, pouring or impinging over the electronics enclosure 10 at location 100 on chassis cover 12 is diverted away from apertures, opening or entries into the electronics enclosure 10.

Figure 2:
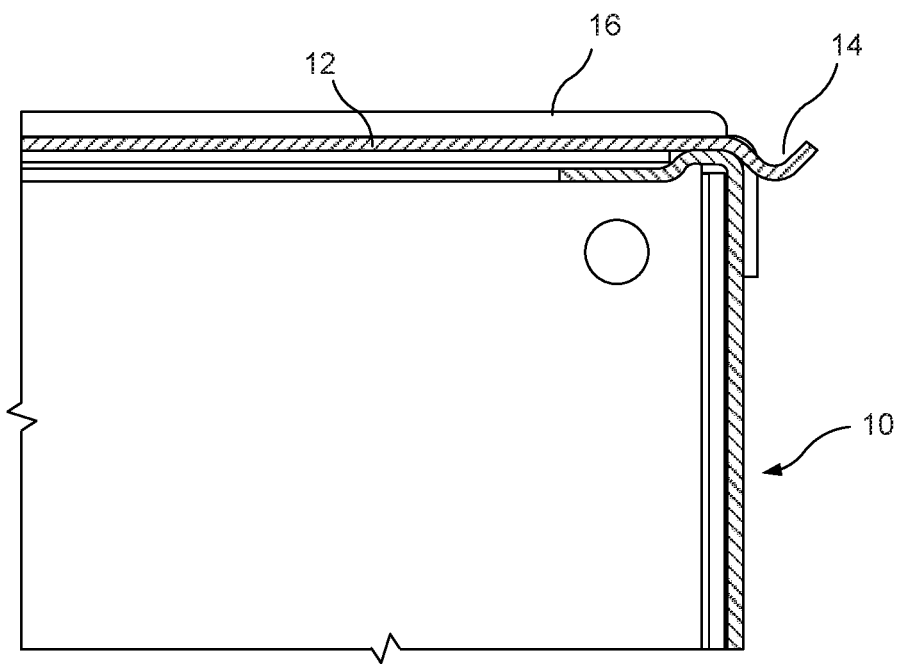
FIG. 2 is a cross-sectional view along plane 2-2 of FIG. 1, illustrating the gutter of the present disclosure.
Figure 3:
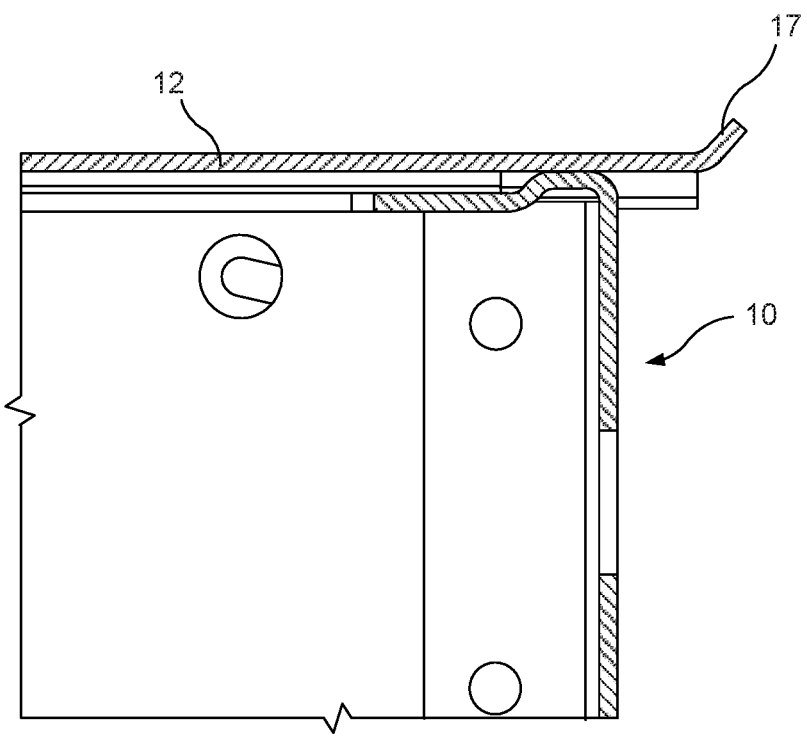
FIG. 3 is a cross-sectional view along plane 3-3 of FIG. 1, illustrating the raised lip.
Figure 4:
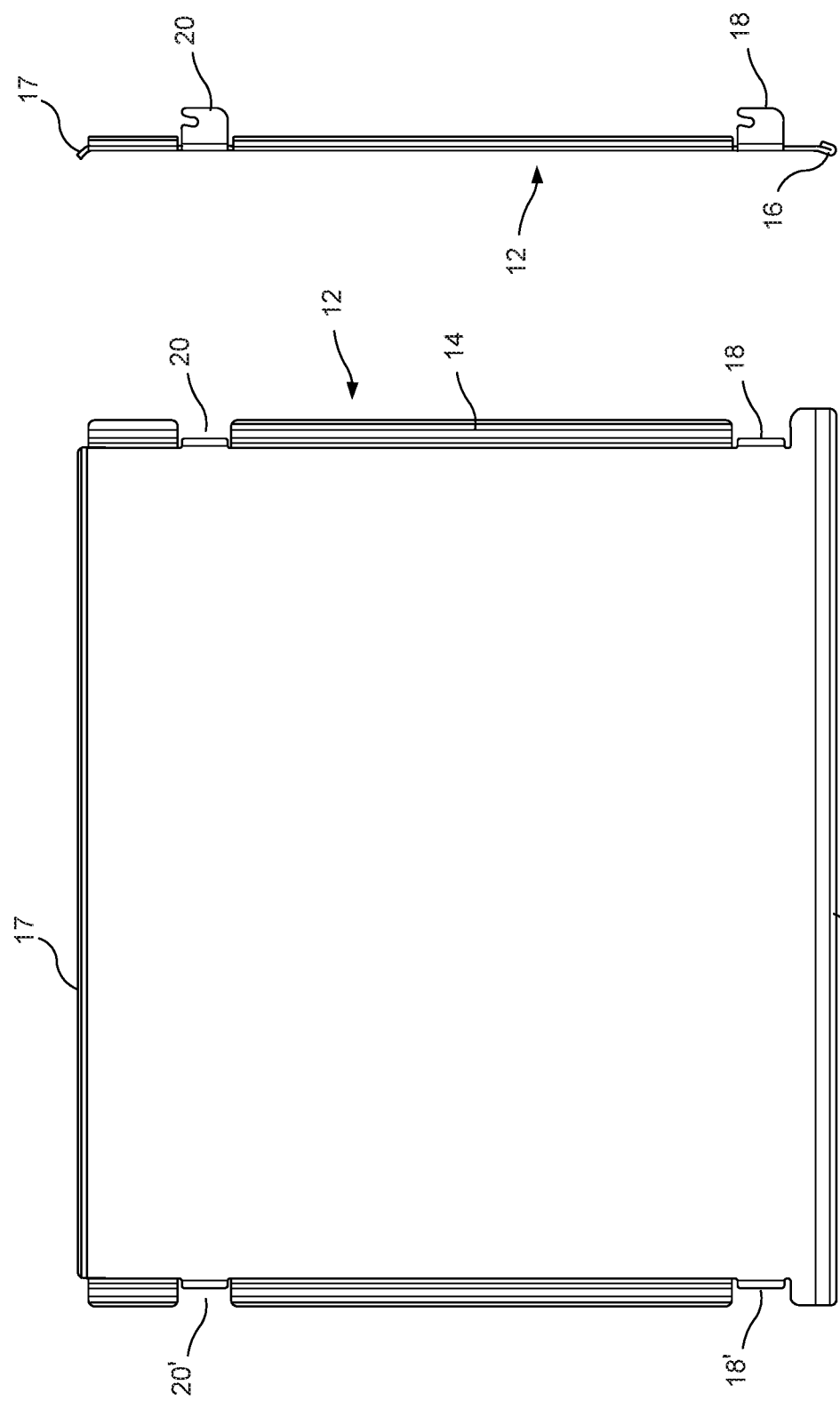
FIG. 4 is a top plan view of an embodiment of the chassis cover of the present disclosure.
Figure 5:
FIG. 5 is a first edge view of an embodiment of the chassis cover of the present disclosure.
Figure 6:
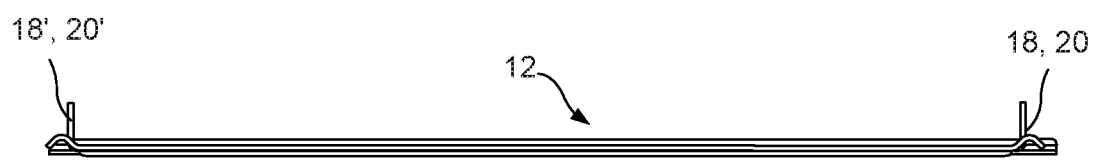
FIG. 6 is a second edge view of an embodiment of the chassis cover of the present disclosure.
Figure 8:
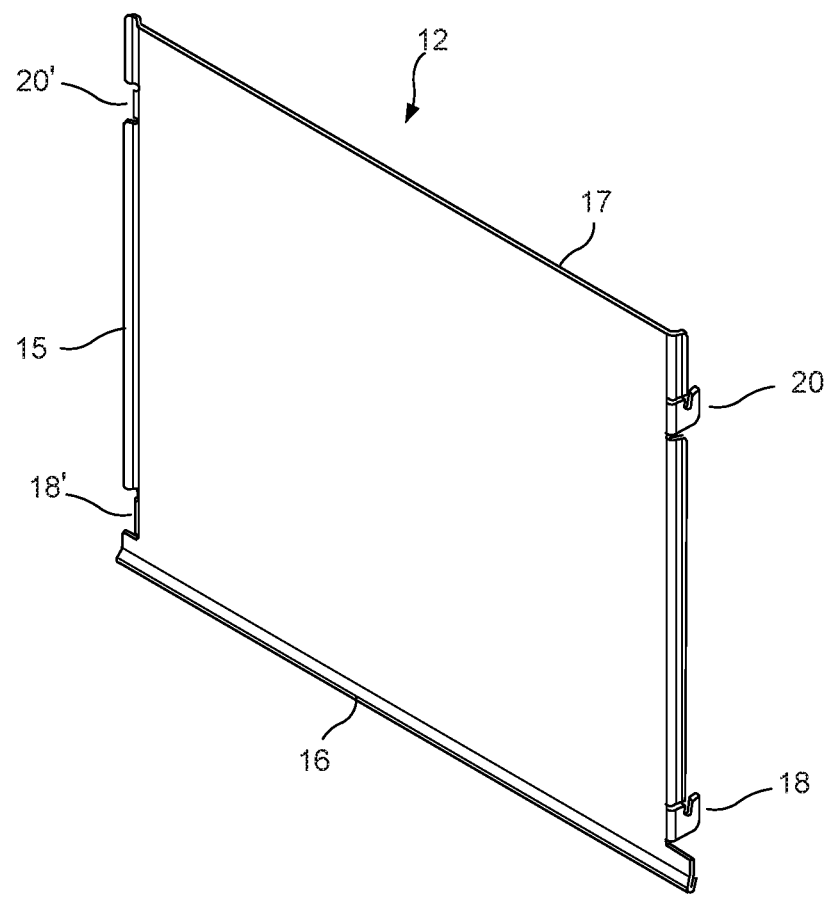
FIG. 8 is a perspective view of an embodiment of the chassis cover of the present disclosure.

FIG. 1 illustrates the electronics enclosure 10, which is typically made of sheet metal, being subjected to water or other liquid flowing dripping, pouring, or impinging from a source above the enclosure 10, which may be in excess of the volume of water the electronics enclosure 10 expect to see in any ordinary operation or course of events, such as, but not limited to, materials testing applications. The chassis cover 12 is square or rectangular in shape with four sides or edges and farther includes gutters 14 and 15, configured as fast channels which may include troughs, raised portions, depressed portions, contours or indentations (see FIG. 2 for a cross-sectional view of a typical gutter 14), around a first pair of opposed sides of the four sides of the chassis cover 12, directing water (or other liquid) to an exit port or predetermined spot incorporated into downwardly extending tabs 18 and 20 (secured by respective bolts 19, 21 to side walls of the electronics enclosure 10) on gutter 14, and downwardly extending tabs 18' and 20' (shown in FIGS. 4-9 and secured to side walls by bolts similar to bolts 19, 20) on gutter 15. Additionally, raised lips 16, 17 (see FIG. 3 for a cross-sectional view of raised lip 17) are presented on a second pair of opposed sides of the chassis cover 12. Raised lips 16, 17 can likewise be configured as second channels which may include troughs, raised portions, depressed portions, contours or indentations. Gutters 14, 15 and raised lips 16, 17 form the periphery of the chassis cover 12. This combination of gutters 14, 15, raised lips 16, 17 and the positioning of the exit ports incorporated into tabs 18, 18', 20, 20' results in directing the water away from the air intake 30 and the electronic terminal 32, the backplane 34 and similar openings and elements.

It is envisioned that some embodiments may include a first channel configuration around a portion or the entirety of the periphery of the chassis cover 12.

FIG. 1 shows that the water ingress prevention strategy works well, holding a large amount of water and properly redirecting it where desired.

FIGS. 4-8 illustrate various view of the chassis cover 12, including further detail of the gutters 14, 15, raised lips 16, 17 and tabs 18, 18', 20, 20'. Tab 18, 20 is illustrated directly opposing tabs 18', 20' on opposite sides of the chassis cover. Further, it is noted that in the illustrated embodiment of FIG. 7, raised lip 16 is formed at a 165 degree angle with the chassis cover 12 while raised lip 17 is formed at a 135 degree angle, in order to direct impinging liquid away from the raised lips 16, 17 and toward the gutters 14, 15. Those skilled in the art will recognize that these values are representative and may vary in different embodiments.

Thus the several aforementioned objects and advantages are most effectively attained. Although preferred embodiments of the invention have been disclosed and described in detail herein, it should be understood that this invention is in no sense limited thereby.

What is claimed is:

1. An electronics enclosure including an upper chassis cover, wherein the upper chassis cover includes a first channel around at least a first portion of the periphery thereof, the first channel arranged and constructed to direct liquid impinging from above the electronics enclosure to at least one pre-determined location of the periphery to flow downwardly therefrom along an exterior of the electronics enclosure thereby avoiding or minimizing entry of liquid into an interior of the electronics enclosure.

2. The electronics enclosure of claim 1 wherein the first channel is chosen from the group consisting of a gutter, a trough, a raised portion, a depressed portion, a contour and an indentation.

3. The electronics enclosure of claim 1 wherein the upper chassis cover includes a second channel around at least a second portion of the periphery thereof, the second channel arranged and constructed to direct impinging liquid to the first channel.

4. The electronics enclosure of claim 3 wherein the second channel is chosen from the group consisting of a raised lip, a trough, a raised portion, a depressed portion, a contour and an indentation.

5. The electronics enclosure of claim 3 wherein the upper chassis cover includes four sides, comprising a first pair of opposed sides and a second pair of opposed sides.

6. The electronics enclosure of claim 5 wherein the first pair of opposed sides comprises the first portion of the periphery, including the first channel.

7. The electronics enclosure of claim 6 wherein the second pair of opposed sides comprises the second portion of the periphery, including the second channel.

8. The electronics enclosure of claim 7 wherein each of the first pair of opposed sides includes at least one pre-determined location to direct impinging liquid to flow downwardly therefrom.

9. The electronics enclosure of claim 7 wherein each of the first pair of opposed sides includes at least two pre-determined locations to direct impinging liquid to flow downwardly therefrom.

10. The electronics enclosure of claim 7 including at least one element selected from the group consisting of a backplane, an air intake, an opening, and an electronic terminal, wherein the pre-determined location of the periphery is chosen to direct impinging liquid away from the at least one element.

11. The electronics enclosure of claim 1 wherein the predetermined location is incorporated into at least one tab in the upper chassis cover, the at least one tab being secured to a side wall of the electronics enclosure.

12. An upper chassis cover for an electronics enclosure, the upper chassis cover including a first channel around at least a first portion of the periphery thereof, the first channel arranged and constructed to direct liquid impinging from above the electronics enclosure to at least one pre-determined location of the periphery to flow downwardly therefrom along an exterior of the electronics enclosure thereby avoiding or minimizing entry of liquid into an interior of the electronics enclosure.

13. The upper chassis cover of claim 12 wherein the first channel is chosen from the group consisting of a gutter, a trough, a raised portion, a depressed portion, a contour and an indentation.

14. The upper chassis cover of claim 12 further including a second channel around at least a second portion of the periphery thereof, the second channel arranged and constructed to direct impinging liquid to the first channel.

15. The upper chassis cover of claim 14 wherein the second channel is chosen from the group consisting of a raised lip, a trough, a raised portion, a depressed portion, a contour and an indentation.

16. The upper chassis cover of claim 15 further including four sides, comprising a first pair of opposed sides and a second pair of opposed sides.

17. The upper chassis cover of claim 16 wherein the first pair of opposed sides comprises the first portion of the periphery, including the first channel.

18. The upper chassis cover of claim 17 wherein the second pair of opposed sides comprises the second portion of the periphery, including the second channel.

19. The upper chassis cover of claim 18 wherein each of the first pair of opposed sides includes at least one pre-determined location to direct impinging liquid to flow downwardly therefrom.

20. A materials testing device including an electronics enclosure which further includes an upper chassis cover, wherein the upper chassis cover includes a first channel around at least a first portion of the periphery thereof, the first channel arranged and constructed to direct liquid impinging from above the electronics enclosure to at least one pre-determined location of the periphery to flow downwardly therefrom along an exterior of the electronics enclosure thereby avoiding or minimizing entry of liquid into an interior of the electronics enclosure.

* * * * *